United States Patent
Huang

(10) Patent No.: US 10,983,854 B2
(45) Date of Patent: Apr. 20, 2021

(54) MEMORY CONTROLLER AND INITIALIZATION METHOD FOR USE IN DATA STORAGE DEVICE

(71) Applicant: Silicon Motion, Inc., Jhubei (TW)

(72) Inventor: Sheng-Yuan Huang, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 89 days.

(21) Appl. No.: 16/598,323

(22) Filed: Oct. 10, 2019

(65) Prior Publication Data

US 2021/0026718 A1 Jan. 28, 2021

(30) Foreign Application Priority Data

Jul. 23, 2019 (TW) .................................. 108125941

(51) Int. Cl.
| | |
|---|---|
| *G06F 11/07* | (2006.01) |
| *G06F 11/10* | (2006.01) |
| *G06F 12/02* | (2006.01) |
| *G06F 12/0882* | (2016.01) |
| *G11C 11/4072* | (2006.01) |
| *G11C 11/409* | (2006.01) |

(52) U.S. Cl.
CPC ........ *G06F 11/076* (2013.01); *G06F 11/1064* (2013.01); *G06F 12/0246* (2013.01); *G06F 12/0882* (2013.01); *G11C 11/409* (2013.01); *G11C 11/4072* (2013.01)

(58) Field of Classification Search
None
See application file for complete search history.

(56) References Cited

U.S. PATENT DOCUMENTS

| | | | | |
|---|---|---|---|---|
| 8,041,884 | B2 * | 10/2011 | Chang | G11C 16/10 |
| | | | | 711/103 |
| 10,108,366 | B2 * | 10/2018 | Huang | G06F 11/079 |
| 10,552,063 | B2 * | 2/2020 | Papandreou | G06F 3/0665 |
| 2017/0269870 | A1 * | 9/2017 | So | G06F 3/064 |

FOREIGN PATENT DOCUMENTS

WO 2017/074591 A1 5/2017

\* cited by examiner

*Primary Examiner* — Phung M Chung
(74) *Attorney, Agent, or Firm* — McClure, Qualey & Rodack, LLP

(57) ABSTRACT

A memory controller is provided. The memory controller is coupled to a flash memory that includes a plurality of physical blocks, and each physical block includes a plurality of physical pages, and some of the physical pages are defective physical pages. The memory controller includes a processor that is configured to set a total target initialization time for an initialization process of the flash memory. The processor sequentially selects a current physical block from among all the physical blocks to perform the initialization process, and it performs a read operation of the initialization process on the current physical block using a read-operation threshold. In response to the read operation of the current physical block being completed, the processor dynamically adjusts the read-operation threshold of the read operation of the physical blocks, so that the initialization process is completed within the total target initialization time.

23 Claims, 5 Drawing Sheets

MEMORY CONTROLLER AND INITIALIZATION METHOD FOR USE IN DATA STORAGE DEVICE

CROSS REFERENCE TO RELATED APPLICATIONS

This Application claims priority of Taiwan Patent Application No. 108125941, filed on Jul. 23, 2019, the entirety of which is incorporated by reference herein.

BACKGROUND OF THE INVENTION

Field of the Invention

The present invention relates to data storage devices and, in particular, to a memory controller, a data storage device, and an initialization method for use in the data storage device.

Description of the Related Art

There are two basic classifications for computer memory: normal memory and downgrade memory. A memory may include a plurality of memory cells for storing data. When the manufacturer of a memory wants to ship the memory, the memory must first undergo a production test to verify whether the memory cells in the memory can correctly store data. If the memory is tested and cannot correctly store data, the manufacturer will classify the memory that cannot pass the test as a downgrade memory that is sold at a low price.

That is, due to errors in the semiconductor manufacturing process, a downgrade memory may include defective memory cells, and the defective memory cells cannot store data normally. The aforementioned defects may include defective blocks in the memory that cannot be correctly accessed, a connection defect between the components of the memory, or another defect. However, there are still blocks in the downgrade memory that can be accessed normally, and thus the usable memory capacity of the downgrade memory is smaller than that of the normal memory.

There are many electronic products on the market that use downgrade flash memory, such as USB flash drives and flash memory cards, among others. The downgrade flash memory in this kind of electronic product need to be opened (which is called initialization) before being shipped from the factory. For example, during the card-initializing procedure of downgrade flash memory, the memory controller on the test equipment is utilized to perform operations such as erase operations, data write/read operations on all physical pages in the downgrade flash memory (e.g., it may include one or more flash memory chips), selecting the physical blocks and physical pages that can be normally accessed from the downgrade flash memory, and recording the physical addresses of both the good and defective physical bocks and physical pages, thereby determining the useable capacity of the downgrade memory.

However, because the number of defects in the downgrade flash memory is quite large, the number of physical pages that cannot be normally accessed is also large. Accordingly, the time spent on the card-initializing procedure of the downgrade flash memory is significantly higher than that spent on the card-initializing procedure of the normal flash memory. It will cause that all physical pages in the downgrade memory cannot be tested within a reasonable amount of time, resulting in low productivity.

Accordingly, there is a demand for a memory controller, a data storage device, and a method for dynamically initializing the downgrade flash memory to solve the aforementioned problem.

BRIEF SUMMARY OF THE INVENTION

In an exemplary embodiment, a memory controller is provided. The memory controller is coupled to a flash memory that includes a plurality of physical blocks, and each physical block comprises a plurality of physical pages, and some of the physical pages among some of the physical blocks are defective physical pages. The memory controller includes: a processor, configured to set a total target initialization time for an initialization process of the flash memory. The processor sequentially selects a current physical block among all of the physical blocks to perform the initialization process of the flash memory, and performs a read operation of the initialization process on the current physical block using a read-operation threshold. In response to the read operation of the current physical block being completed, the processor dynamically adjusts the read-operation threshold of the read operation of the physical blocks, so that the initialization process of the flash memory is completed within the total target initialization time.

In another exemplary embodiment, a data storage device is provided. The data storage includes a flash memory and a memory controller. The flash memory includes a plurality of physical blocks, wherein each physical block comprises a plurality of physical pages, and some of the physical pages among some of the physical blocks are defective physical pages. The memory controller is configured to set a total target initialization time for an initialization process of the flash memory. The memory controller sequentially selects a current physical block among all of the physical blocks to perform the initialization process of the flash memory, and performs a read operation of the initialization process on the current physical block using a read-operation threshold. In response to the read operation of the current physical block being completed, the memory controller dynamically adjusts the read-operation threshold of the read operation of the physical blocks, so that the initialization process of the flash memory is completed within the total target initialization time.

In yet another exemplary embodiment, an initialization method for use in a data storage device is provided. The data storage device includes a flash memory that has a plurality of physical blocks, and each physical block comprises a plurality of physical pages, and some of the physical pages among some of the physical blocks are defective physical pages. The method includes the following steps: setting a total target initialization time of the flash memory; sequentially selecting a current physical block from among all of the physical blocks to perform the initialization process of the flash memory, and performing a read operation of the initialization process on the current physical block using a read-operation threshold; and in response to the read operation of the current physical block being completed, dynamically adjusting the read-operation threshold of the read operation of the physical blocks, so that the initialization process of the flash memory is completed within the total target initialization time.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
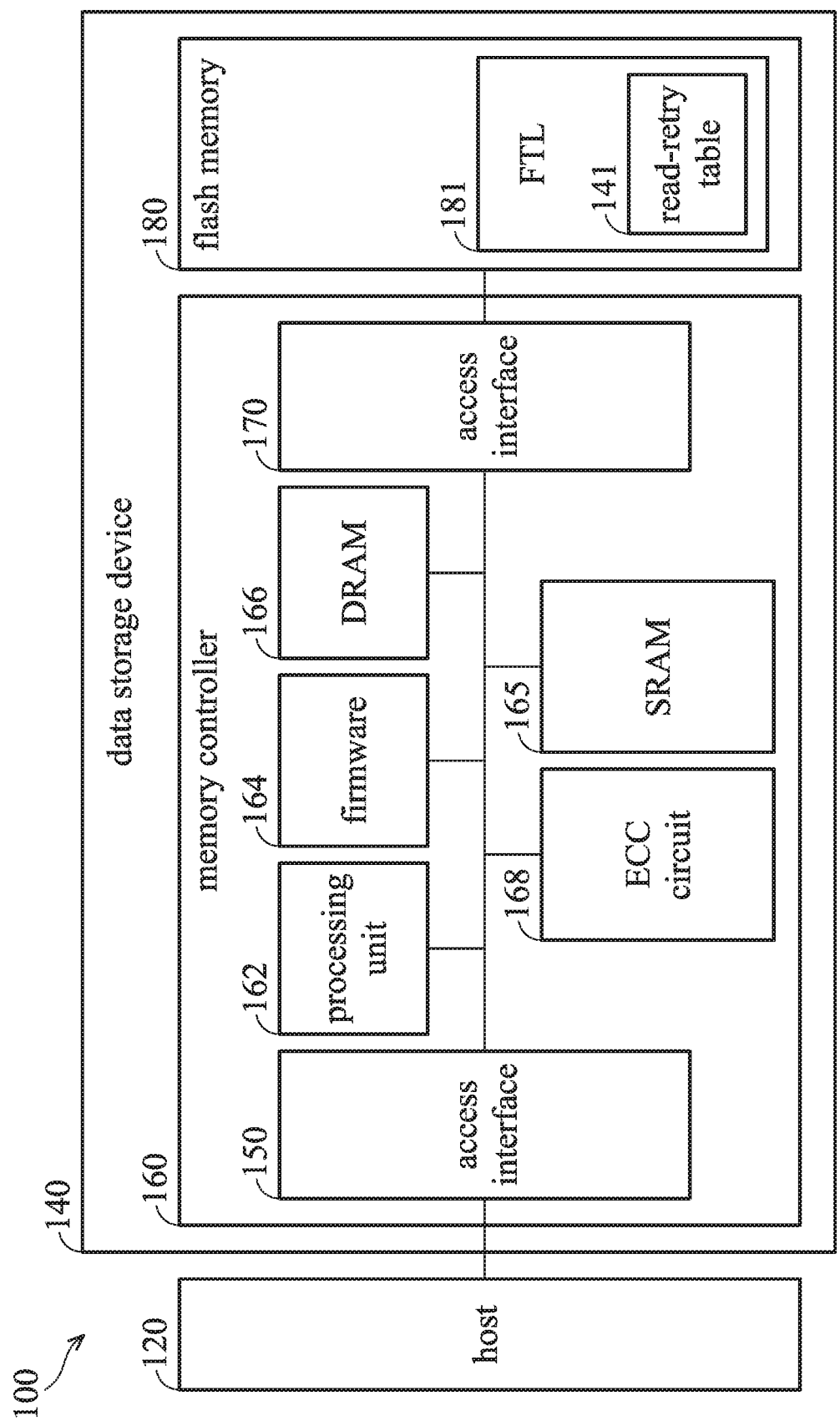
FIG. 1 is a block diagram of an electronic device in accordance with an embodiment of the invention.

FIG. 1 is a block diagram of an electronic device in accordance with an embodiment of the invention. The electronic device 100 may be a personal computer, a data server, a network-attached storage (NAS), a portable electronic device, etc., but the invention is not limited thereto. The portable electronic device may be a laptop, a hand-held cellular phone, a smartphone, a tablet PC, a personal digital assistant (PDA), a digital camera, a digital video camera, a portable multimedia player, a personal navigation device, a handheld game console, or an e-book, but the invention is not limited thereto.

The electronic device 100 includes a host 120 and a data storage device 140. The data storage device 140 includes a memory controller 160 and a flash memory 180. The memory controller 160 includes a processing unit 162, firmware 164, a static random-access memory (SRAM) 165, a dynamic random access memory (DRAM) 166, and an error-correction circuit 168. The processing unit 162 can be implemented in various manners, such as dedicated hardware circuits or general-purpose hardware (for example, a single processor, a multi-processor capable of performing parallel processing, or another processor with computation capability). For example, the processing unit 162 may be implemented by a general-purpose processor or a microcontroller, but the invention is not limited thereto. The processing unit 162 in the controller 160 may control the flash memory 180 according to the command from the host 120, such as writing data to a designated physical address of the flash memory 180 or reading page data from a designated physical address from the flash memory 180.

In the electronic device 100, several electrical signals for coordinating commands and data transfer between the processing unit 162 and the flash memory 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the flash memory 180 using a SDR (Single Data Rate) protocol or a DDR (Double Data Rate) protocol, such as ONFI (open NAND flash interface), DDR toggle, or others. The processing unit 162 may communicate with the host 120 through an access interface 150 using a designated communication protocol, such as USB (Universal Serial Bus), ATA (Advanced Technology Attachment), SATA (Serial ATA), PCI-E (Peripheral Component Interconnect Express), NVME (Non-volatile Memory Express), or others.

The storage unit 163 may be a non-volatile memory such as a read-only memory (ROM), an erasable programmable read-only memory (EPROM), an electrically erasable programmable read-only memory (EEPROM), or an e-fuse, but the invention is not limited thereto. The storage unit 163 may store firmware 164. The firmware 164 may include boot code or a boot loader that is executed by the processing unit 162, and the memory controller 160 may be booted up based on the firmware to control operations of the flash memory 180. The DRAM 166 is configured to store program codes, setting parameters, temporary data, and the logical-to-physical mapping table to improve the performance of the system. In some embodiments, the DRAM 166 is not necessary, and the SRAM 165 of the memory controller 160 or a host memory buffer (HMB) in the host 120 can be used to store the program codes, setting parameters, temporary data, and logical-to-physical mapping table.

The flash memory 180, for example, may be a NAND flash memory and the flash memory may include a plurality of physical blocks, and each physical block may include a plurality of physical pages, and each physical page may include a plurality of memory cells. The aforementioned memory cells can be implemented by a single-level cell (SLC), a multi-level cell (MLC), a triple-level cell (TLC), or a quadruple-level cell (QLC), but the invention is not limited thereto. In an embodiment, the flash memory 180 may be a downgrade flash memory that includes a plurality of downgrade flash-memory dies. Some of the physical pages in a portion of the physical blocks in the flash memory 180 may include defective memory cells that cannot store data normally.

In an embodiment, when the data storage device 140 is in the card-initializing stage (e.g., an initialization stage), the memory controller 160 does not know the status of each physical page in physical block in the flash memory 180 yet, such as whether each physical page being a normal physical page or a defective physical page. The memory controller 160 may write specific page data into a selected physical page one by one, and read the page data from the selected physical page to determine whether the page data being read out matches the previously written specific page data. If the page data being read out matches the previously written specific page data, the memory controller 160 can determine that the selected physical page can store data normally.

After the memory controller 160 reads the page data in a specific physical page in the flash memory 180 with a selected read threshold voltage, the read page data is transmitted to the error-correction circuit 168 that is configured to perform error correction on the page data, where the aforementioned error correction can be referred to as hard decoding. In some embodiments, the error-correction circuit 168 may include a low-density parity-check code (LDPC) error correction engine (not shown in FIG. 1), and/or a BCH-code error-correction engine (not shown in FIG. 1), but the invention is not limited thereto.

Specifically, the specific page data that is written to the selected physical page by the memory controller 160 may include a data portion and an ECC portion, wherein the error-correction code may include LDPC error-correction code and/or the BCH error-correction code. The error-correction circuit 168 may perform error-correction on the data portion and/or the ECC portion of the specific page data according to the error-correction code of the retrieved page data. In some embodiments, after a predetermined number of trials by hard decoding (e.g., BCH-code error correction) has been performed and the retrieved page data cannot be corrected, soft decoding is performed by the processing unit 162 that takes much more time than hard decoding. Accordingly, in the initialization stage of the flash memory 180, the memory controller 160 does not perform error correction using soft decoding.

Generally, the error-correction circuit 168 has a predetermined error-correction capability. For example, it may be capable of correcting N-bits of data, where the value of N depends on the length of the error-correction code. If the number of error bits in the retrieved page data of the specific physical page is smaller than or equal to N, the error-correction circuit 168 may perform error correction on the retrieved page data according to the error-correction code in the retrieved page data, and transmit the corrected page data to the processing unit 162.

If the number of error bits in the retrieved page data is greater than N, the error-correction circuit 168 cannot perform error correction on the retrieved page data according to the error-correction code in the retrieved page data, the error-correction circuit 168 may inform the memory controller 160 of failure of error correction. Meanwhile, the memory controller 160 will start a read-retry procedure to try to obtain correctable page data.

For example, in the read-retry procedure, read operations may be performed on the selected physical page according to a read-retry table 141. The read-retry table 141 may include a predetermined number of entries (e.g., M entries), and each entry records a respective read-threshold voltage Vth for performing the read operation. In an embodiment, the read-retry table 141, for example, can be integrated into the flash-translation layer 181. In another embodiment, the read-retry table 141 can be stored in the flash memory 180. When the read-retry procedure is performed, the read-retry table 141 is obtained from the flash memory 180. In yet another embodiment, the read-retry table can be referred to as a lookup table in the memory controller 160, and can be implemented by a hardware circuit such as a complex programmable logic device (CPLD), a programmable array logic (PAL), or a programmable logic array (PLA), but the invention is not limited thereto.

In an embodiment, after starting the read-retry procedure, the processing unit 162 may sequentially use the read-threshold voltage stored in each entry of the read-retry table 141 until the retrieved page data from the specific physical page can be successfully corrected by the error-correction circuit 168 or the read-threshold voltages in all entries of the read-retry table 141 have been tried to read the page data in the specific physical page. When the processing unit 162 has used all read-threshold voltages in all entries of the read-retry table 141 to read the page data in the specific physical page and the error-correction circuit 168 is still not capable of correcting the retrieved page data using each read-threshold voltage in the read-retry table 141, the processing unit 162 may determine that the specific physical page is defective, and record the physical address of the specific physical page in a defect-record table.

It should be noted that it may take an approximately fixed time Tr each time the processing unit 162 use a respective read-threshold voltage to read the page data in the specific physical page. If the processing unit 162 can successfully read the page data in the specific physical page for the first time using the default read-threshold voltage, the time taken is Tr. If the processing unit 162 uses a different read-threshold voltage (including the default read-threshold voltage) 25 times to successfully read the page data in the specific physical page, the time taken is 25 Tr.

In addition, during the mass production of the data storage device 140, it is not possible to utilize a large amount of time to test all physical pages in the flash memory 180. For example, the total target initialization time can first be set to 8 hours or 12 hours, for example. When the time taken for the initialization process of the data storage device 140 has reached the total target initialization time, the processing unit 162 will stop the initialization process. At this time, the processing unit 162 may count the number of physical pages that can be accessed normally in the tested physical pages of the flash memory 180, and label the defective physical pages in the tested pages. With regard to the physical pages of the flash memory 180 that have not been tested, the processing unit 162 will not perform further testing, but will treat the untested physical pages of the flash memory 180 as defective physical pages.

Accordingly, the available capacity information of the flash memory 180 counted by the memory controller 160 may include the number of physical pages that can be accessed normally among the tested physical pages during the initialization process of the flash memory 180.

In the first embodiment, after the processing unit 162 has used different read-threshold voltages in all entries of the read-retry table 141 and cannot successfully read the page data of the specific physical page (i.e., the retrieved page data from the specific physical page cannot be corrected by the error-correction circuit 168), the processing unit 162 may determine that the specific physical page is defective. For example, if the read-retry table include 49 entries, given that the specific physical page is actually a defective physical page, the processing unit 162 still has to perform 50 read operations on the specific physical page before determining that the specific physical page is defective. That is, the processing unit 162 may set the default number of retries to 50, and when the processing unit 162 determines that the specific physical page is defective, it has taken a time of 50 Tr.

In the initialization process of the flash memory 180 performed by the memory controller 160, the memory controller 160 may start from the physical page having the smallest physical address, and then sequentially perform access tests on the physical page of a larger physical address. Given that the data storage device 140 is equipped with a normal flash memory which may include one or more flash memory dies, if the total capacity of each flash memory die in the uninitialized flash memory is, for example, 16 G bytes, the time it takes the processing unit 162 to erase, write, and read all physical pages in one flash memory die is approximately 1 minute, 50 minutes, and 10 minutes, respectively. If each physical block in the flash memory includes 256 physical pages and the size of each page is 16K bytes, the size of each physical block is 4M bytes. Thus, a flash memory die with a size of 16 G-bytes may include 4096 physical blocks or 256*4096=1048576 physical pages, and a read operation or a read-retry operation performed on a physical page may take 0.5~0.6 ms.

When the processing unit 162 performs a read test on a specific physical page in the normal flash memory, it often needs to use the default read-threshold voltage (i.e., read the page data once) or to use a small number of different read-threshold voltages (i.e., a small number of read-retry operations) to successfully read the specific page data that has previously been written to the specific physical page in the writing test. Accordingly, the read test on the normal flash memory in the initialization process does not take much time. If the total capacity of a normal flash memory is 128 G bytes (e.g., including 8 flash memory dies of 16 G-byte), the processing unit 162, for example, is capable of testing all physical pages in each flash memory die of the normal flash memory in the initialization process within about 8 hours.

However, if the data storage device 140 is equipped with a poorer quality flash memory 180 than a normal flash memory, the distribution of locations of defective physical pages in the flash memory 180 may vary. In the first embodiment, if the flash memory 180 has a poor quality, or has a great number of defective physical pages, or the defective physical pages are located in physical addresses in the front portion of the flash memory 180, the processing unit 162 will take a lot of time to perform the read-retry test, and determine that the specific physical page is a defective physical page after the default predetermined number of read-retry operations have been performed. Accordingly, if the flash memory 180 of the data storage device 140 has a total capacity of 128 G bytes (e.g., 8 flash memory dies of 16 G bytes in size) before the initialization process, the processing unit 162 will take a maximum time of about 8*50=400 hours to perform read-retry operations on all physical pages in the flash memory 180 to determine whether each physical page is a defective physical page. At this time, the initialization process of the flash memory 180 is mainly on the reading operation.

If 50% of the physical pages in the flash memory 180 are defective physical pages, the processing unit 162 needs to take about 8*50*0.5=200 hours to find all defective physical pages in the flash memory 180, and such a long initialization time is not suitable for mass production. If the total target initialization time of a flash memory die of 16 G bytes in size is 8 hours or 12 hours, the number of physical pages that the processing unit 162 can test in the flash memory 180 is very limited. When the initialization process of the flash memory 180 reaches the total target initialization time, the processing unit 162 may forcibly stop the initialization process, and therefore, in this case, the available capacity of the flash memory 180 is relatively small.

In the second embodiments, the processing unit 162 may use a dynamic initialization mechanism based on a time budget to initialize the flash memory 180. For example, when the total target initialization time (i.e., time limit or time budget) is limited, the processing unit 162 can dynamically adjust the read-retry count threshold (e.g., an upper limit) that is used on each physical page of the next selected physical block, so that the processing unit 162 can finish the read operations of all physical blocks in the downgrade flash memory within the total target initialization time, thereby preventing the data storage device 140 from having no available capacity or small available capacity after the data storage device is initialized. When the number of read-retry operations of a specific physical page in a specific physical block has reached the read-retry count threshold that is used for the specific physical block, the processing unit 162 may forcibly stops the initialization process of the specific physical page, and start the initialization process of the next physical page.

For example, before the processing unit 162 starts the initialization process of the flash memory 180, the processing unit 162 may set the total target initialization time, which can be adjusted to suit the capacity of the flash memory 180. For example, the target initialization time for a flash memory die of 16 G bytes in size may be set to 1 hour. If the flash memory 180 includes multiple flash memory dies, the total target initialization time $T_{total}$ can be calculated by multiplying the target initialization time with the number of flash memory dies in the flash memory 180.

In addition, when the processing unit 162 starts to perform the initialization process of the flash memory 180, the processing unit 162 may first use a default read-retry count threshold $RN_{default}$ default (e.g., 50) as the read-retry count threshold for each physical page of the first selected physical block.

For convenience of description, the default read-retry count threshold may indicate the upper limit of read operations for reading the selected physical page with the default read-threshold voltage or other different read-threshold voltages in the read-retry procedure. The processing unit 162 may also record the elapsed read time $T_{passed}$ in the procedure of reading each physical page of the first physical block with the default read-retry count threshold $RN_{default}$.

When the processing unit 162 has finished the read-retry operations of each physical page in the first physical block, the processing unit 162 may calculate the predicted initialization time $T_{predict}$, remaining usable initialization time $T_{remain}$, and read-retry count average threshold $RN_{avg}$ that are used to calculate the next read-retry count threshold $RN_{next}$ for each physical page of the next physical block, wherein the next read-retry count threshold $RN_{next}$ is smaller than or equal to the default read-retry count threshold $RN_{default}$. That is, when the memory controller 160 selects the next physical block as the current physical block, the processing unit 160 may use the calculated next read-retry count threshold $RN_{next}$ as the read-retry count threshold RN for the current physical block.

For example, the processing unit 162 may calculate the predicted initialization time $T_{predict}$ according to the number of physical blocks already read $N_{read}$, the total number of physical blocks $N_{total}$, and the elapsed read time $T_{passed}$, wherein the predicted initialization time $T_{predict}$ can be expressed using equation (1):

$$T_{predict} = \frac{T_{passed} \times N_{total}}{N_{read}} \quad (1)$$

In addition, the processing unit 162 further calculates the remaining usable initialization time $T_{remain}$ according to the total target initialization time and the elapsed read time $T_{passed}$, wherein the remaining usable initialization time $T_{remain}$ can be expressed using equation (2):

$$T_{remain} = T_{total} - T_{passed} \quad (2)$$

In addition, the processing unit 162 further calculates the read-retry count average threshold $RN_{avg}$ for all physical blocks that have already been read according to the number $N_{read}$ and the read-retry count accumulated threshold $RN_{acc}$ for all physical blocks that have already been read, where the read-retry count average threshold $RN_{avg}$ can be expressed using equation (3):

$$RN_{avg} = \frac{RN_{acc}}{N_{read}} \quad (3)$$

If the read-retry count average threshold $RN_{avg}$ calculated from equation (3) is not an integer, its rounding portion can be rounded off or unconditionally rounded off to obtain an integer value.

In some embodiments, the processing unit 162 may separately record the read-retry count threshold RN for each of the current physical block and previous physical blocks (e.g., can be recorded in a read-retry count threshold table in the SRAM 165 or DRAM 190), and these recorded read-retry count thresholds RN are accumulated to obtain the read-retry count accumulated threshold $RN_{acc}$. For example, if the first physical block Block0 and the second physical block Block1 of the flash memory 180 have been initialized and the read-retry count thresholds RN for the first physical block Block0 and the second physical block Block1 are respectively 50 and 49 times, the processing unit 162 may calculate the read-retry count accumulated threshold $RN_{acc}$=50+49=99 times.

In some other embodiments, the processing unit 162 may directly add the read-retry count threshold RN for the currently selected physical block to the read-retry count accumulated threshold $RN_{acc}$ (i.e., has an initial value of 0). The processing unit 162 may reset the read-retry count accumulated threshold $RN_{acc}$ after finishing read operations of all physical blocks of the flash memory 180 (i.e., the initialization process is finished).

After the processing unit 162 has calculated the predicted initialization time $T_{predict}$, remaining usable initialization time $T_{remain}$, and read-retry count average threshold $RN_{avg}$, the processing unit 162 may calculate the next read-retry count threshold $RN_{next}$ for read operations of each physical page of the next physical block according to the calculated predicted initialization time $T_{predict}$, remaining usable initialization time $T_{remain}$, and read-retry count average threshold $RN_{avg}$, wherein the next read-retry count threshold $RN_{next}$ can be calculated using equation (4):

$$RN_{next} = \frac{RN_{avg} \times T_{remain}}{T_{predict}} \quad (4)$$

If the next read-retry count threshold $RN_{next}$ calculated from equation (4) is not an integer, its rounding portion can be rounded off or unconditionally rounded off to obtain an integer value. In response to the next read-retry count threshold $RN_{next}$ being calculated, the processing unit 162 may read the next physical block, and update the number of physical blocks being read $N_{read}$, elapsed read time $T_{passed}$, and read-retry count accumulated threshold $RN_{acc}$. The aforementioned procedure will be repeated until the read operations for all physical blocks of the flash memory 180 have completed.

For example, if the currently selected physical block is a normal physical block, the processing unit 162 may theoretically read each the page data in each physical page of the physical block with a small read-retry count. Thus, it takes less time to initialize the physical block. However, in cases where the time constraint is fixed, if the initialization time for the current physical block is less, it indicates that the initialization time that can be allocated for the remaining physical blocks of the flash memory 180 is more. That is, a greater read-retry count threshold RN can be used to read page data from each remaining physical block of the flash memory 180, which also means that there is a higher probability to obtain normal physical pages, thereby obtaining a higher available capacity.

Conversely, in the same case where the time constraint is fixed, if the initialization time for the physical block is more, it indicates that the initialization time that can be allocated for the remaining physical blocks of the flash memory 180 is less. That is, a smaller read-retry count threshold RN can be used to read page data from each remaining physical block of the flash memory 180. With regard to the actual defective physical pages, there is no difference if the final determination result uses a greater read-retry count threshold or a smaller read-retry count threshold because the error-correction circuit 168 is unable to perform error correction on the retrieved page data to obtain correct page data. Thus, the processing unit 162 may determine that the selected physical page is a defective physical page at an earlier time than when the read-retry count has reached the read-retry count threshold.

The dynamic initialization method in the second embodiment of the invention is capable of dynamically adjusting the read-retry count threshold for the next physical block according to the calculated predicted initialization time $T_{predict}$, remaining usable initialization time $T_{remain}$, and read-retry count average threshold $RN_{avg}$. If physical blocks with a large number of defective physical pages are continuously encountered during the initialization process, the read-retry count threshold for the next physical block is gradually reduced.

Accordingly, in cases where the total target initialization time is limited, the processing unit 162 may dynamically adjust the read-retry count threshold for the next physical block, so that the processing unit 162 is capable of reading all physical blocks of the flash memory 180 within the total target initialization time.

Figure 2:
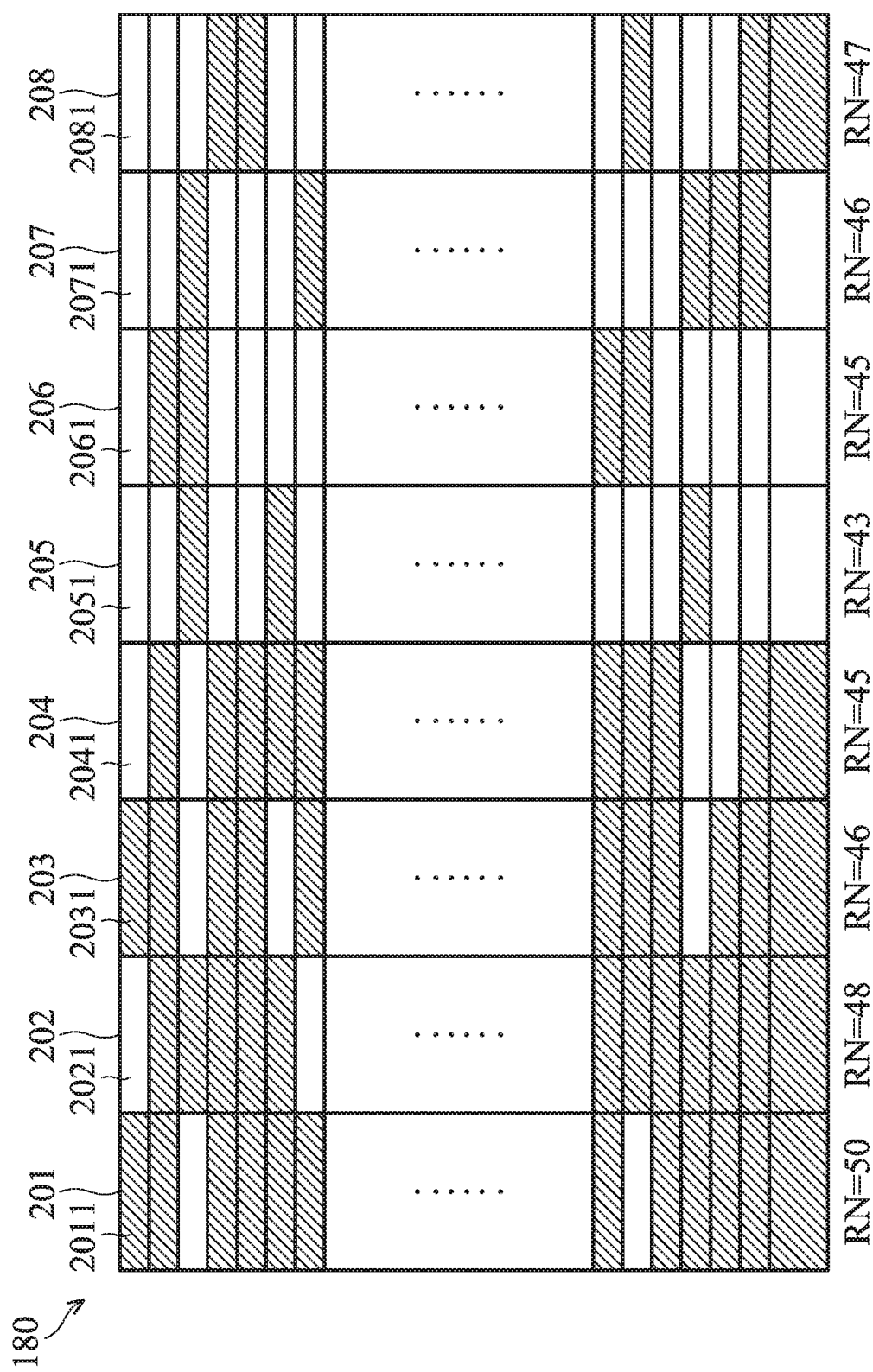
FIG. 2 is a diagram of dynamically adjust the read-retry count thresholds for different physical blocks in accordance with the second embodiment of the invention.

FIG. 2 is a diagram of dynamically adjust the read-retry count thresholds for different physical blocks in accordance with the second embodiment of the invention.

As depicted in FIG. 2, the processing unit 162 may sequentially perform the initialization process on the physical blocks 201 to 208, and the physical blocks 201 to 204 has a greater number of defective physical pages, and the physical blocks 205 to 208 has a smaller number of defective physical pages. The physical pages labeled with slashes represent defective physical pages, and the blanked physical pages represent normal physical pages. If the read-retry count threshold RN for physical block 201 is 50 times, the read-retry count threshold RN for physical block 202 may be 48 times, calculated using the method described in the second embodiment of the invention. The read-retry count thresholds RN for physical blocks 203, 204, and 205 may respectively be 46 times, 45 times, and 43 times, calculated in a similar manner. Since physical block 205 has a smaller number of defective physical pages, it indicates that the processing unit 162 may quickly perform the initialization process for all physical pages in physical block 205, and thus more remaining available initialization time can be allocated for the subsequent physical blocks that have been initialized yet.

However, the read-retry count threshold RN for physical block 205 is determined upon finishing the initialization process of physical block 204, the read-retry count threshold RN=43 is used for the initialization process for physical block 205. Upon the initialization process of physical block 205 being completed, the processing unit 162 may calculate the read-retry count threshold RN=45 for physical block 206 according to the method described in the second embodiment. Similarly, upon completion of the initialization process of physical blocks 206 and 207, the processing unit 162 may calculate the read-retry count thresholds RN=46 and 47 respectively for physical blocks 207 and 208 according to the method described in the second embodiment. It should be noted that the aforementioned embodiment is an example for describing the dynamic initializing method of the present invention being capable of dynamically adjusting the read-retry count threshold, but the invention is not limited to the aforementioned numeric values.

In the third embodiment, when the processing unit 162 is performing the initialization process on the selected physical block, the processing unit 162 may dynamically adjust the number of physical pages required to be read in each physical block, so that the processing unit 162 may finish the read operations of all physical blocks of the flash memory 180 within the total target initialization time.

For example, in the first embodiment and second embodiment, the total target initialization time Ttotal is set to the allowed time limit for performing read operations on all physical pages of each physical block of the flash memory 180, and the purpose is to initial all physical blocks of the flash memory 180 within the time limit.

Assuming that a physical block includes 4096 physical pages (e.g., a first page number), when the processing unit 162 starts to perform the initialization process on the flash memory 180, the processing unit 162 may sequentially perform read operations on each of the physical pages of the first page number in the selected physical block.

When the read operations for the current physical block are completed, the processing unit 162 may calculate the elapsed read time $T_{passed}$, remaining available initialization time $T_{remain}$, and predicted initialization time $T_{predict}$.

In addition, the processing unit 162 may calculate the read-page average count $RP_{avg}$ according to the number of physical blocks already read $N_{read}$, and the read-page accumulated count $RP_{read}$ for all physical blocks already read, where the read-page average count $RP_{avg}$ can be expressed using equation (5):

$$RP_{avg} = \frac{RP_{acc}}{N_{read}} \quad (5)$$

If the read-page average count $RP_{avg}$ calculated from equation (5) is not an integer, its rounding portion can be rounded off or unconditionally rounded off to obtain an integer value.

After the processing unit 162 has calculated the predicted initialization time $T_{predict}$, remaining usable initialization time $T_{remain}$, and read-page accumulated count $RP_{read}$, the processing unit 162 may calculate the next read-page count threshold $RP_{next}$ for read operations of each physical page of the next physical block according to the calculated predicted initialization time $T_{predict}$, remaining usable initialization time $T_{remain}$, and read-page average count $RP_{avg}$, wherein the next read-page count threshold $RP_{next}$ can be calculated using equation (6):

$$RP_{next} = \frac{RP_{avg} \times T_{remain}}{T_{predict}} \quad (6)$$

If the next read-page average count $RP_{next}$ calculated from equation (6) is not an integer, its rounding portion can be rounded off or unconditionally rounded off to obtain an integer value. In response to the next read-page average count $RP_{next}$ being calculated, the processing unit 162 may read the next physical block, and use the calculated next read-page average count $RP_{next}$ as the read-page count threshold RP. At this time, the processing unit 162 may further update the number of physical blocks being read $N_{read}$, elapsed read time $T_{passed}$, and read-page accumulated count $RP_{acc}$. The aforementioned procedure will be repeated until the read operations for all physical blocks of the flash memory 180 have completed.

When the number of physical pages that have been read has accumulated to the read-page count threshold RP, the processing unit 162 may forcibly stop the initialization process of the currently selected physical block, and select the next physical block as the current physical block for initialization.

In an embodiment, when the processing unit 162 forcibly stops the initialization process of the currently selected physical block, the processing unit 162 may record physical addresses of the defective physical pages in the currently selected physical block, such as recording the physical addresses of the defective physical pages in a defect-record table. It should be noted that if the read-page count threshold RP is smaller than the total number of physical pages in the physical block, it indicates that some physical pages in the currently selected physical block will not be read. When the processing unit 162 forcibly stop the initialization process of the currently selected physical block, the processing unit 162 may directly label the unread physical pages in the currently selected physical block as defective physical pages.

Accordingly, the method described in the third embodiment of the invention is capable of dynamically adjusting the read-page count threshold RP, so that the processing unit 162 can finish the read operations of all physical blocks in the downgrade flash memory within the total target initialization time, thereby preventing the data storage device 140 from having no available capacity or small available capacity after the data storage device is initialized. In addition, the methods in the second embodiment and third embodiment of the present invention can be performed separately or together.

Figure 3:
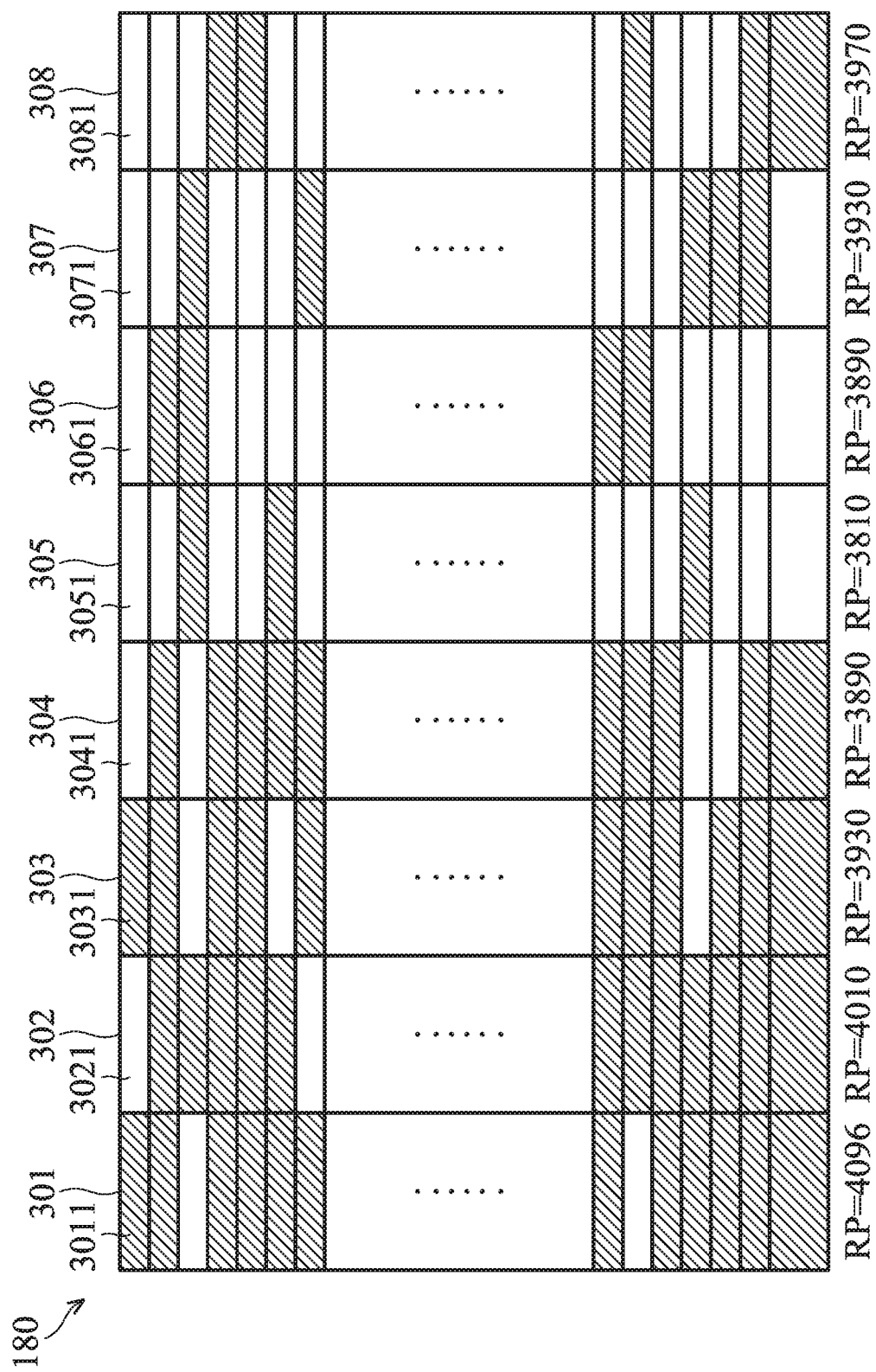
FIG. 3 is a diagram of dynamically adjust the read-page count thresholds for different physical blocks in accordance with the third embodiment of the invention.

FIG. 3 is a diagram of dynamically adjust the read-page count thresholds for different physical blocks in accordance with the third embodiment of the invention.

As depicted in FIG. 3, the processing unit 162 may sequentially perform the initialization process on the physical blocks 301 to 308, and the physical blocks 301 to 304 have a greater number of defective physical pages, and the physical blocks 305 to 308 have a smaller number of defective physical pages. The physical pages labeled with slashes represent defective physical pages, and the blanked physical pages represent normal physical pages. If the read-page count threshold RP for physical block 301 is 4096, the read-page count threshold RP for physical block 302 may be 4010 that is calculated using the method described in the second embodiment of the invention. The read-page count threshold RP for physical blocks 303, 304, and 305 may respectively be 3930, 3890, and 3810 that can be calculated in a similar manner. Since physical block 305 has a smaller number of defective physical pages, it indicates that the processing unit 162 may quickly perform the initialization process for all physical pages in physical block 305, and thus more remaining available initialization time can be allocated for the subsequent physical blocks that have been initialized yet.

However, the read-page count threshold RP for physical block 305 is determined upon finishing the initialization process of physical block 304, the read-page count threshold RP=3810 is used for the initialization process for physical block 305. Upon the initialization process of physical block 305 being completed, the processing unit 162 may calculate the read-page count threshold RP=3890 for physical block 306 according to the method described in the third embodiment. Similarly, upon completion of the initialization process of physical blocks 306 and 307, the processing unit 162 may calculate the read-page count threshold RP=3930 and 3970 respectively for physical blocks 307 and 308 according to the method described in the third embodiment. It should be noted that the aforementioned embodiment is an example for describing the dynamic initializing method of the present invention being capable of dynamically adjusting the read-page count threshold RP, but the invention is not limited to the aforementioned numeric values.

Figure 4:
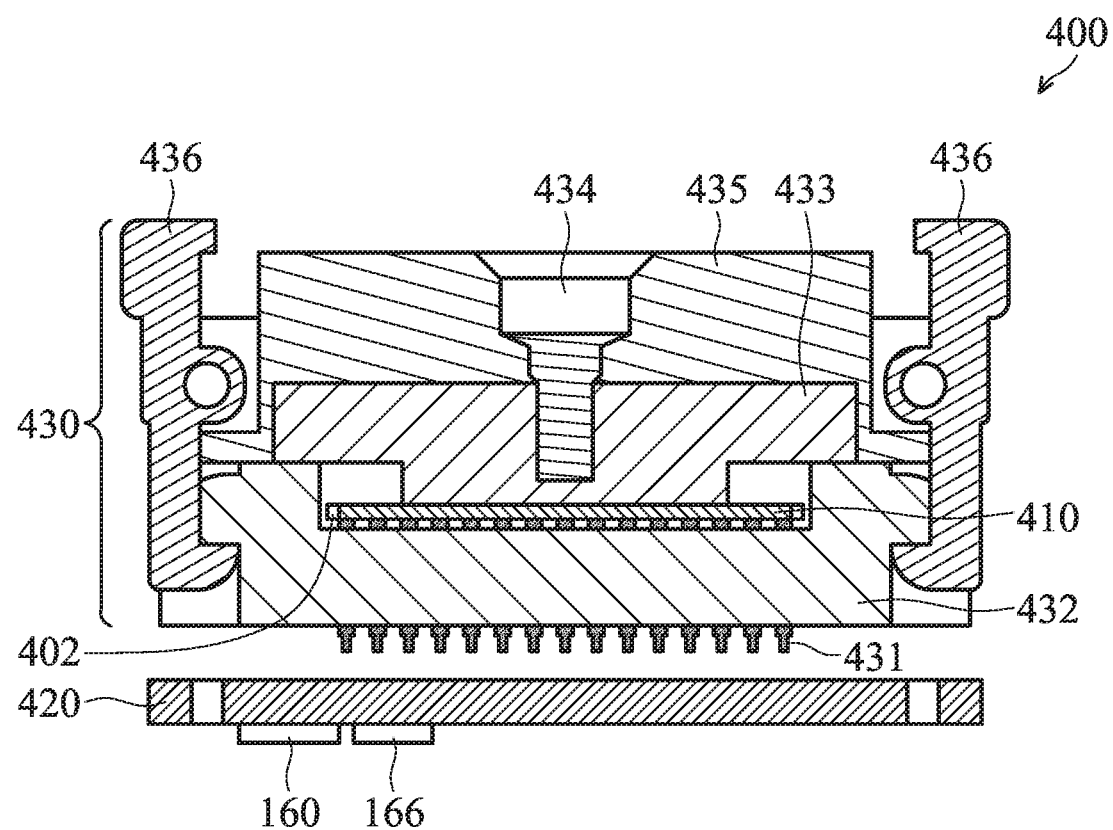
FIG. 4 is a diagram of a memory-testing apparatus in accordance with an embodiment of the invention.

FIG. 4 is a diagram of a memory-testing apparatus in accordance with an embodiment of the invention.

Referring to FIG. 1 and FIG. 4, in an embodiment, the memory-testing apparatus includes a slot device 430, and the slot device 430 includes a plurality of double-headed probes 431, a probe-fixing bracket, a slider 433, a spring 434, and an upper cover 435, wherein the upper cover 435 includes clips 436 on both sides. The flash memory die 410 to be tested can be placed at location 402 in the slot device 430. The double-headed probe 431 is used to electrically connect the flash memory die 410 to the test circuit board 420, and the double-headed probe 431 corresponds to a plurality of pins of the flash memory die 410. The memory controller 160 and the DRAM 190, for example, can be disposed on the test circuit board 420 to control the flash memory die 410 to be initialized.

Since the wafer thickness of the flash memory die 410 may vary, the spring 434 having a suitable spring force may be selected during the initialization process, so that the slider 433 presses the wafer of the flash memory die 410 to connect to the double-headed probe 431 more efficiently. After the initialization process of the flash memory die 410 is completed, the user can take out the slider 433 to replace another flash memory chip 410 that has not yet been initialized, and place it at location 402. The embodiments of FIGS. 1-3 can be referred to for details of the initialization process of the flash memory die 410, and they will not be described in detail herein.

Figure 5:
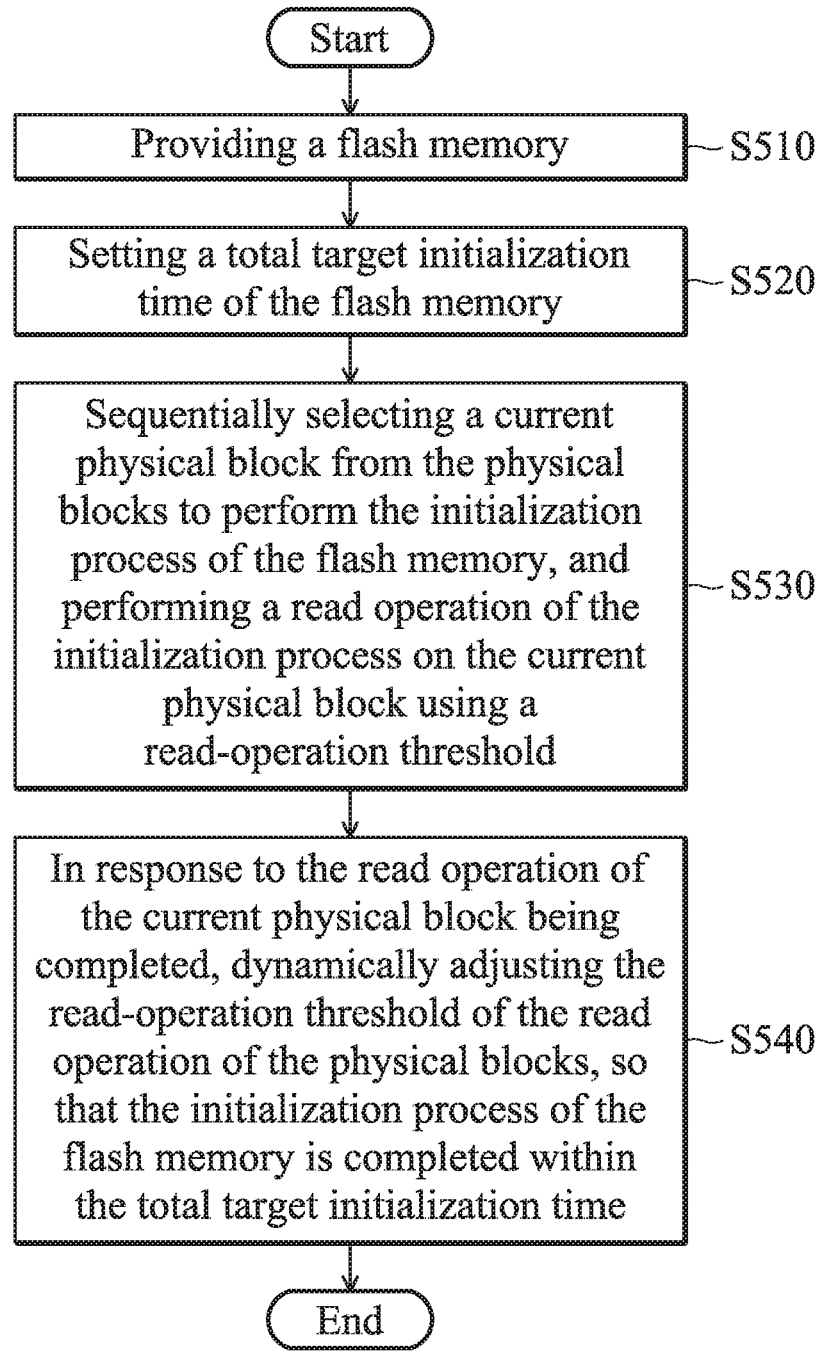
FIG. 5 is a flow chart of an initialization method for use in a data storage device in accordance with an embodiment of the invention.

FIG. 5 is a flow chart of an initialization method for use in a data storage device in accordance with an embodiment of the invention.

In step S510, a flash memory 180 is provided, wherein the flash memory 180 includes a plurality of physical blocks, and each physical block includes a plurality of physical pages. In addition, some physical pages in some physical blocks are defective physical pages.

In step S520, the memory controller 160 may set a total target initialization time for the flash memory 180. The flash memory 180 may include one or more flash memory dies, and a target initialization time can be set for each flash memory die, and the total target initialization time can be calculated by multiplying the target initialization time with the number of flash memory dies.

In step S530, the memory controller 160 sequentially selects a current physical block from the physical blocks to perform an initialization process of the flash memory 180, and perform a read operation on the current physical block using a read-operation threshold. For example, the read-operation threshold may be the read-retry count threshold in the second embodiment or the read-page count threshold in the third embodiment.

In step S540, in response to the read operations of the current physical block being completed, the memory controller 160 dynamically adjust the read-operation threshold for the read operation of a next physical block, so that the initialization process of the flash memory 180 is completed within the total target initialization time. The content of the second embodiment and the third embodiment can be referred to for further details of dynamically adjusting the read-operation threshold. If the read-retry count threshold in the second embodiment is used as the read-operation threshold, the corresponding read-operation count and read-operation average threshold are the read-retry count and the read-retry count average threshold, respectively. If the read-page count threshold is used as the read-operation threshold, the corresponding read-operation count and read-operation average threshold are the read-page count and read-page count average threshold, respectively. That is, in the read operation of the current physical block, when the read-operation count has reached the read-operation threshold, the memory controller 160 will forcibly stop the read operation of the current physical block, and update the read-operation threshold for the next physical block.

In view of the above, a memory controller, a data storage device, and an initialization method for use in a data storage device are provided in the present invention. The memory controller, data storage device, and initialization method are capable of dynamically adjusting the read-operation threshold that is used for read operations in the physical block according to the read-operation average threshold, remaining available initialization time, and predicted initialization time in the initialization process of the flash memory, so that the time taken for the initialization process of the flash memory can be significantly reduced, and can be completed within a predetermined time limit (e.g., total target initialization time), thereby preventing the data storage device from having no available capacity or small available capacity after the data storage device is initialized when the conventional method is used.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller, coupled to a flash memory, wherein the flash memory comprises a plurality of physical blocks, and each physical block comprises a plurality of physical pages, and some of the physical pages among some of the physical blocks are defective physical pages, the memory controller comprising:

a processor, configured to set a total target initialization time for an initialization process of the flash memory,
wherein the processor sequentially selects a current physical block from the physical blocks to perform the initialization process of the flash memory, and performs a read operation of the initialization process on the current physical block using a read-operation threshold,
wherein in response to the read operation of the current physical block being completed, the processor dynamically adjusts the read-operation threshold of the read operation of the physical blocks, so that the initialization process of the flash memory is completed within the total target initialization time.

2. The memory controller as claimed in claim 1, wherein the flash memory comprises one or more flash memory dies, and the processor sets the total target initialization time according to a number of the one or more flash memory dies.

3. The memory controller as claimed in claim 1, wherein the processor sequentially selects a current physical page from the current physical block, and sequentially uses each read-threshold voltage recorded in a read-retry table to perform the read operation on the current physical page to obtain page data until the page data can be successfully corrected by an error-correction circuit in the memory controller or until a read-operation count of the read operation of the current physical page has reached the read-operation threshold.

4. The memory controller as claimed in claim 3, wherein in response to the read operation of the current physical block being completed, the processor obtains an elapsed read time of the initialization process of the flash memory, and calculates a predicted initialization time for the initialization process according to a first number of the physical blocks being read in the initialization process, a total number of the physical blocks, and the elapsed read time.

5. The memory controller as claimed in claim 4, wherein the processor further subtracts the total target initialization time by the elapsed read time to obtain remaining available initialization time.

6. The memory controller as claimed in claim 5, wherein the read-operation threshold is a read-retry count threshold, and the read-operation count is a read-retry count.

7. The data storage device as claimed in claim 6, wherein the processor divides a read-retry accumulated count of the physical blocks that have been read in the initialization process by the first number to obtain a read-retry count average threshold of the physical blocks that have been read in the initialization process.

8. The memory controller as claimed in claim 7, wherein the processor further multiplies the read-retry count average threshold with the remaining available initialization time to obtain a first value, and divides the first value by the predicted initialization time to obtain a next read-retry count threshold, and sets the next read-retry count threshold as the read-operation threshold of the read operation performed on a next physical block.

9. The memory controller as claimed in claim 5, wherein the read-operation threshold is a read-page count threshold, and the read-operation count is a read-page count.

10. The memory controller as claimed in claim 9, wherein the processor divides a read-page accumulated count of the physical blocks that have been read in the initialization process by the first number to obtain a read-page average count of the physical blocks that have been read in the initialization process.

11. The memory controller as claimed in claim 10, wherein the processor multiplies the read-page average count with the remaining available initialization time to obtain a second value, and divides the second value by the predicted initialization time to obtain a next read-page count threshold, and sets the read-page count threshold as the read-operation threshold of the read operation performed on a next physical block.

12. An initialization method for use in a data storage device, wherein the data storage device comprises a flash memory, wherein the flash memory comprises a plurality of physical blocks, and each physical block comprises a plurality of physical pages, and some of the physical pages among some of the physical blocks are defective physical pages, the method comprising:
setting a total target initialization time for the flash memory;
sequentially selecting a current physical block from the physical blocks to perform the initialization process of the flash memory, and performing a read operation of the initialization process on the current physical block using a read-operation threshold; and
in response to the read operation of the current physical block being completed, dynamically adjusting the read-operation threshold of the read operation of the physical blocks, so that the initialization process of the flash memory is completed within the total target initialization time.

13. The method as claimed in claim 12, wherein the flash memory comprises one or more flash memory dies, and the total target initialization time is set according to a number of the one or more flash memory dies.

14. The method as claimed in claim 12, further comprising:
sequentially selecting a current physical page from the current physical block; and
sequentially using each read-threshold voltage recorded in a read-retry table to perform the read operation on the current physical page to obtain page data until the page data can be successfully corrected by an error-correction circuit or until the read-operation count of the read operation of the current physical page has reached the read-operation threshold.

15. The method as claimed in claim 12, wherein the step of dynamically adjusting the read-operation threshold of the read operation of the physical blocks comprises:
in response to the read operation of the current physical block being completed, obtaining an elapsed read time of the initialization process of the flash memory, and calculating a predicted initialization time of the initialization process according to a first number of the physical blocks being read in the initialization process, a total number of the physical blocks, and the elapsed read time.

16. The method as claimed in claim 15, wherein the step of dynamically adjusting the read-operation threshold of the read operation of the physical blocks further comprises:
subtracting the total target initialization time by the elapsed read time to obtain the remaining available initialization time.

17. The method as claimed in claim 16, wherein the read-operation threshold is a read-retry count threshold, and the read-operation count is a read-retry count.

18. The method as claimed in claim 17, wherein the step of dynamically adjusting the read-operation threshold of the read operation of the physical blocks further comprises:
dividing a read-retry accumulated count of the physical blocks that have been read in the initialization process by the first number to obtain a read-retry count average threshold of the physical blocks that have been read in the initialization process.

19. The method as claimed in claim 18, wherein the step of dynamically adjusting the read-operation threshold of the read operation of the physical blocks further comprises:
    multiplying the read-retry count average threshold with the remaining available initialization time to obtain a first value;
    dividing the first value by the predicted initialization time to obtain a next read-retry count threshold; and
    setting the next read-retry count threshold as the read-operation threshold of the read operation performed on a next physical block.

20. The method as claimed in claim 16, wherein the read-operation threshold is a read-page count threshold, and the read-operation count is a read-page count.

21. The method as claimed in claim 20, wherein the step of dynamically adjusting the read-operation threshold of the read operation of the physical blocks further comprises:
    dividing a read-page accumulated count of the physical blocks that have been read in the initialization process by the first number to obtain a read-page average count of the physical blocks that have been read in the initialization process.

22. The method as claimed in claim 21, wherein the step of dynamically adjusting the read-operation threshold of the read operation of the physical blocks further comprises:
    multiplying the read-page average count with the remaining available initialization time to obtain a second value;
    dividing the second value by the predicted initialization time to obtain a next read-page count threshold; and
    setting the read-page count threshold as the read-operation threshold of the read operation performed on a next physical block.

23. A data storage device, comprising:
    a flash memory, comprising a plurality of physical blocks, wherein each physical block comprises a plurality of physical pages, and some of the physical pages among some of the physical blocks are defective physical pages; and
    a memory controller, configured to set a total target initialization time for an initialization process of the flash memory,
    wherein the memory controller sequentially selects the current physical block from the physical blocks to perform the initialization process of the flash memory, and performs a read operation of the initialization process on the current physical block using a read-operation threshold,
    wherein in response to the read operation of the current physical block being completed, the memory controller dynamically adjusts the read-operation threshold of the read operation of the physical blocks, so that the initialization process of the flash memory is completed within the total target initialization time.

* * * * *